United States Patent [19]

White et al.

[11] Patent Number: 5,140,688

[45] Date of Patent: Aug. 18, 1992

[54] GAAS INTEGRATED CIRCUIT PROGRAMMABLE DELAY LINE ELEMENT

[75] Inventors: William A. White, Garland; David A. Whitmire, Plano, both of Tex.

[73] Assignee: Texas Instruments Incorporated, Dallas, Tex.

[21] Appl. No.: 300,183

[22] Filed: Jan. 23, 1989

Related U.S. Application Data

[63] Continuation of Ser. No. 929,690, Nov. 10, 1986, abandoned.

[51] Int. Cl.$^5$ .......................... G06F 1/04; G11C 11/00
[52] U.S. Cl. ............................. 395/550; 364/DIG. 1; 364/248.6; 364/232.8.270.7; 364/DIG. 2; 364/953.7; 364/954.2; 364/950.4; 364/927.8; 364/940.3; 365/194
[58] Field of Search .................. 365/76, 194; 364/200 MS file, 900 MS File; 395/550

[56] References Cited

U.S. PATENT DOCUMENTS

| | | | |
|---|---|---|---|
| 4,181,975 | 1/1980 | Jenkins | 364/900 |
| 4,419,739 | 12/1983 | Blum | 364/900 |
| 4,719,375 | 1/1988 | Martin | 307/600 |
| 4,723,120 | 2/1988 | Petty, Jr. | 375/10 X |
| 4,835,725 | 5/1989 | Yassaie et al. | 364/736 |

OTHER PUBLICATIONS

Osborne 4 & 8-Bit Microprocessor Handbook by Osborne and Kane, pp. 1-60 to 1-62, Published by Osborne/McGraw-Hill, Copyright 1981.
Semiconductor Devices: Physics and Technology, by S, M, SZE, Copyright 1985, Published by John Wiley & Sons, pp. 1-3.

Primary Examiner—Gareth D. Shaw
Assistant Examiner—Paul Kulik
Attorney, Agent, or Firm—Rene' E. Grossman; Richard L. Donaldson

[57] ABSTRACT

A semiconductor chip for processing or storing information and a system comprising a plurality of semiconductor chips for processing or storing information. In one form of the invention each chip includes clock input and output circuitry for receiving and transmitting signals of a first frequency and transmission circuitry for receiving and transmitting data. The transmission circuitry is capable of sampling the data at a second clock frequency which is less than the first clock frequency. Circuit components are coupled to the clock circuitry and transmission circuitry for processing the data. In another form of the invention a semiconductor chip comprising clock input and output circuitry, transmission circuitry and circuit components for processing data further includes input circuitry for selecting a variable delay between the time data is received onto the chip and transmitted from the chip In a preferred embodiment of the invention the semiconductor chip includes a memory array for storing data. The transmission circuitry includes a first path for transmitting received data to another like chip and a transmission path capable of combining data which is stored in the memory array with data which is stored in one or more like chips.

9 Claims, 3 Drawing Sheets

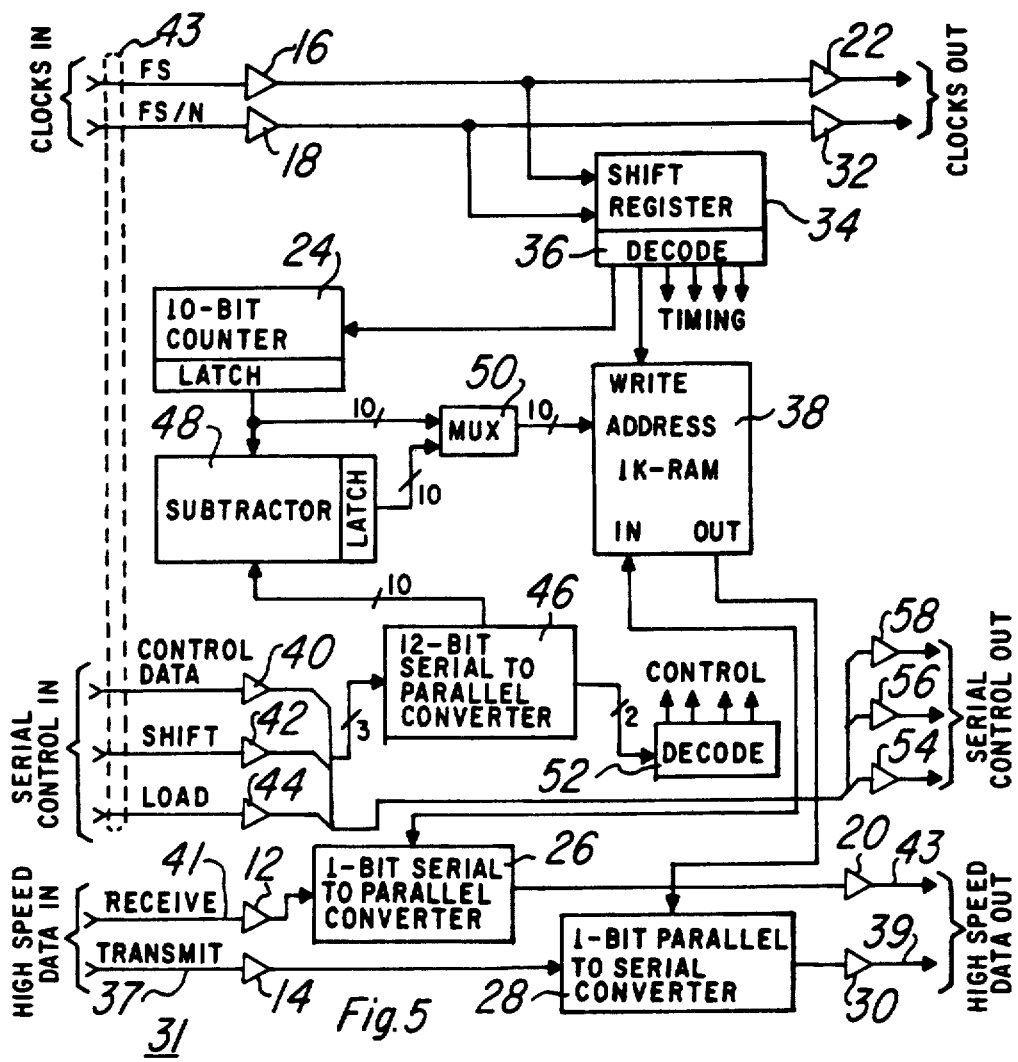
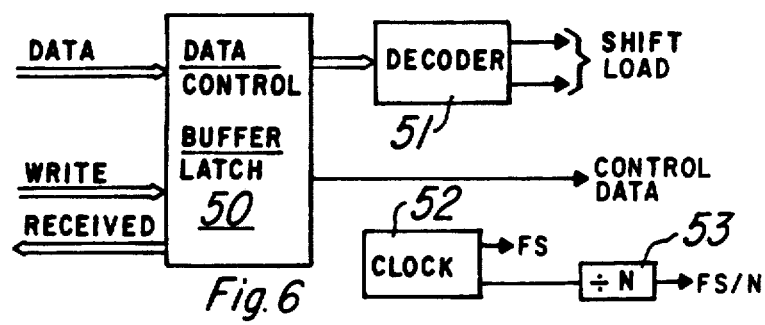

GAAS INTEGRATED CIRCUIT PROGRAMMABLE DELAY LINE ELEMENT

This application is a continuation of application Ser. No. 929,690, filed Nov. 10, 1986, now abandoned.

BACKGROUND OF THE INVENTION

1. Field of the Invention

This invention relates to high speed programmable delay line elements that include gallium arsenide static random access memories (SRAM) circuits and, more particularly, to programmable delay line static random access memories that provide a variable time delay and still more particularly to the radio frequency use of such circuits.

2. BRIEF DESCRIPTION OF THE PRIOR ART

Digital radio frequency memories (DRFM) are utilized in signal acquisition and processing systems which combine analog and digital components to record samples of received radio frequency signals and process the samples in real time. In the conventional DRFM architecture using silicon components high sampling rates of radio frequency signals can be attained with relatively slow memories by demultiplexing the sample data stream into a large number of parallel paths. However, the component count and interconnection complexity rapidly become excessive at the higher sampling rates. At rates on the order of 1 GHz noise is also a problem. With sufficient demultiplexing, the sampling rate of this architecture should be limited by the maximum operating speed of the demultiplexer and multiplexer components and interconnect problems.

In one radio frequency repeater system, a GHz DRFM using the above described architecture including, slow silicon memories and GaAs shift registers for demultiplexing and multiplexing has been reported by B. M. Gilbert, D. J. Schwab, L. M. Pastuszyn, A. Firstenberg and R. H. Evans in an article entitled "Design and Fabrication of a Digital RF Memory Using Custom Designed GaAs Integrated Circuits," IEEE GaAs Integrated Circuit Symposium Technical Digest, Nov. 1985, pages 173 to 176. The system described in this article is extremely complex, requiring an eight layer wire wrap board with more than 100 ECL chips and a twelve layer rf printed wiring board (PWB) for the GaAs components.

It initially appears that the use of all GaAs components in a traditional radio frequency repeater architecture, as described in the above noted prior art in conjunction with silicon devices, should result in a simpler system, since significantly less demultiplexing and multiplexing is required to match the much faster GaAs memories to the input and output data streams. While the narrower demultiplexer and multiplexer components do result in some simplification, such simplification is effectively offset by the complexities that arise from the proportionately higher speed data and address and control lines. High speed buffer networks and fan-out trees must maintain critical timing relationships with respect to the memory address and control lines. Additionally, off-chip propagation delays require precise control. Thus, critical timing relationships must be provided and have required the use of tree circuits to provide individual timing signals from a timing source directly to each chip with appropriate built in circuit delays.

This critical relationship is extremely difficult to achieve in higher speed circuit design. Thus, little or no overall advantage is expected from an all GaAs traditional repeater architecture system over the GaAs demultiplexed system with slow silicon memories.

SUMMARY OF THE INVENTION

Digital radio frequency memory system is now provided with an architecture that takes advantage of higher levels of integration. In particular, high speed control lines and associated buffer circuits are avoided by integrating memory and logic on the same chip. Distributing control and buffer circuits among chips allows for replacement of global interconnections with local interconnections between adjacent chips. This minimizes the effects of off-chip propagation delays. Consequently, significant simplifications in both system architecture and printed wiring board complexity can be obtained.

According to the present invention there is provided a system for maintaining critical timing relationships between various chips in the system by the distributed control concept. In this approach, clock signals are routed through each chip so that both clock and data signals have equal delays from a point just before the output buffer on one chip to a point just after the input buffer on another chip, provided that the transmission lines between chips are of equal length. Thus the requirement for off-chip clock distribution is eliminated and the system provides only a single clock line to the first chip in the chain. This arrangement is useful for all control signals that feed multiple chips including non-time-critical signals, since off-chip circuitry and interconnects are simplified.

In accordance with the above described distributed control concepts, an architecture is provided in which the input demultiplexer, output multiplexer and address generation circuitry are distributed into memory logic chips in which each chip also contains a predetermined amount of static RAM. The chip is characterized herein as a programmable delay line element (PDLE). A cascade of PDLE chips implements the basic DRFM storage and delay functions.

The programmable delay line element chip has a pair of clock inputs, one of which is at the system sampling frequency and the second of which is at a frequency which is the sampling frequency divided by the number of chips in the string. The system also includes an first input and output ports for receiving data and second input and output ports for transmitting data, the data being clocked through single stage multiplexer and demultiplexer circuits at a sampling rate in the gigahertz frequency range.

Using the programmable delay line element chips, a very simple repeater architecture is possible. Each input bit from the analog to digital converter (ADC) passes through a serial string of N programmable delay line element chips which internally demultiplex and store the data. During playback, the programmable delay line element chips reassemble (multiplex) the original bit stream and shift it out to the DAC. The programmable delay line element chips internally buffer all five control signals (clock signals, FS and FS/N where N is the number of chips in a serial string, control data signal, shift signal and load signal) to avoid the need for external buffers and to maintain time alignment between signals.

Four operating modes are possible: reset, receive, transmit and delay. During reset, the addresses are set to zero, data storage is inhibited and the output data stream is set to zero. In the receive mode, the input data are stored in sequential memory locations but the output data stream is maintained at zero. In the transmit mode, input data storage is inhibited but previously stored data are read and output from sequential memory locations. In the delay mode, data are simultaneously being received and transmitted with a programmable delay.

The result is a programmable delay line element chip capable of use in DRFM architecture wherein the memory is integrated with demultiplex/multiplex, address generation and control functions on the same chip. This minimizes the effect of off-chip propagation delay by allowing global system interconnections to be replaced by local interconnections between chips. The DRFM design consists of programmable delay line element chips which can be cascaded to increase the memory length of the DRFM.

BRIEF DESCRIPTION OF THE DRAWINGS

FIG. 5 is a block diagram of the programmable delay line element for DRFM application; and FIG. 6 is a block diagram of the control sequencer of FIG. 4.

DESCRIPTION OF THE PREFERRED EMBODIMENT

Figure 1:
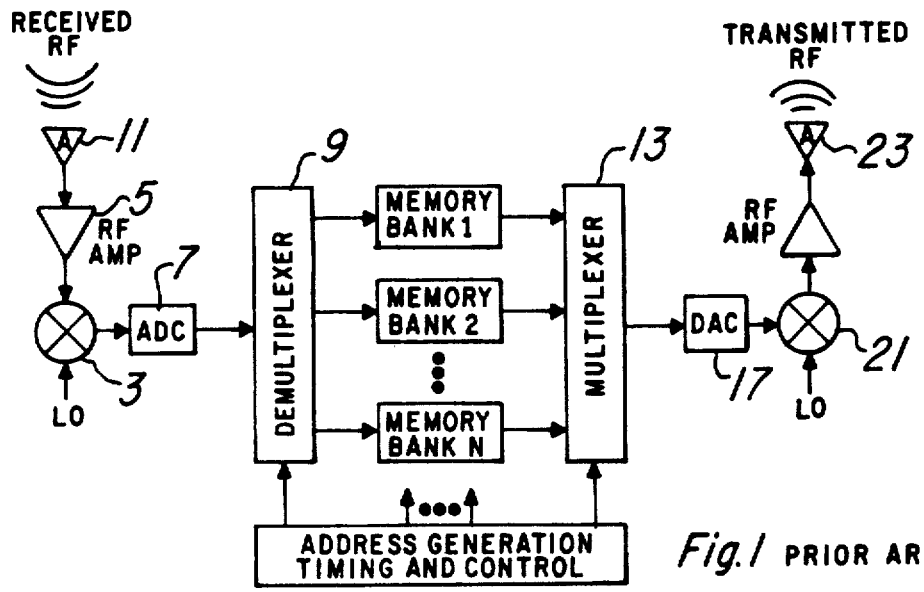
FIG. 1 is a block diagram showing typical architecture for a DRFM of the prior art using silicon components.

Referring first to FIG. 1, there is shown a typical radio frequency repeater incorporating prior art DRFM architecture. A RF signal in analog form with a carrier wave such as a radar signal, is received at the antenna 11, amplified by amplifier 5 and mixed by a mixer 3 with a signal from the local oscillator (LO) to provide a down converted analog signal output. This output is converted to digital information by an A/D converter 7. The received and down converted digitized signal is demultiplexed by demultiplexer 9 and sent along several parallel paths to memory banks (1-N). As indicated in FIG. 1 the multiplexer 13 assembles a high speed output data stream by interleaving data which is output from the memory banks. Thus the output data stream from the multiplexer 13 is a delayed replica of the input data stream. The demultiplexer 9 and a multiplexer 13 enable a relatively slow memory to operate at a relatively high sampling rate. The output from the multiplexer 13 is converted to an analog signal by a D/A converter 17. The converted analog signal is then sent to a mixer 21 wherein it is mixed with a local oscillator signal and retransmitted therefrom via an antenna 23. An example of such prior art structure is also discussed in an article of B. K. Gilbert et al., "Design and Fabrication of a Digital RF Memory using custom Designed GaAs Integrated Circuits," Government Micro Circuits Applications Conference, 1984 Digest of Papers, Nov. 8, 1984, Las Vegas Nev. The system described in the Gilbert et al article is extremely complex, requiring an eight layer wrap board with more than 1000 ECL chips and a twelve layer rf printed wiring board for the GaAs components and complex timing distribution schemes.

Figure 2:
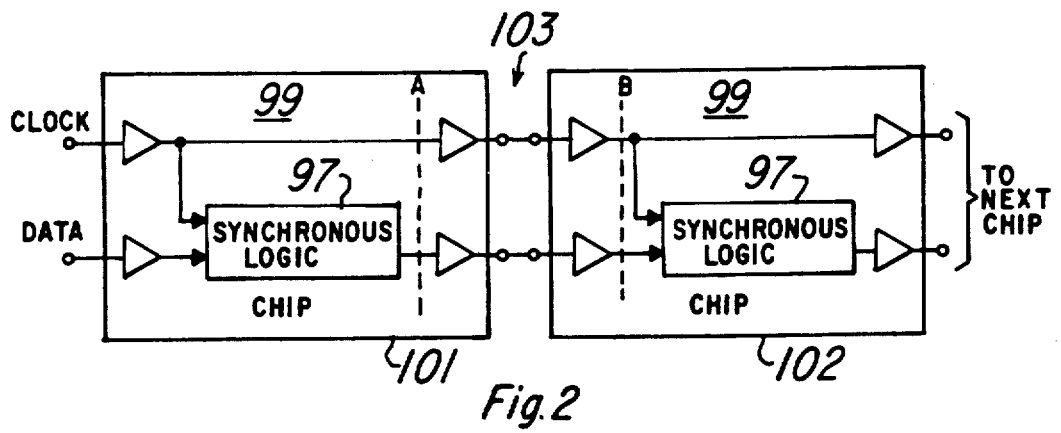
FIG. 2 is a block diagram of the distributed control for clocking synchronous logic in accordance with the present invention.

A solution to the problem of maintaining critical timing relationships between various chips in a system is set forth in FIG. 2 in accordance with the present invention. In this approach, clock signals are routed through a series of synchronous logic chips 99 so that both clock signals and data signals which are operated upon in the logic circuitry contained in a particular chip 99 have equal delays from a point A on a first chip to a point B on an adjacent chip in the cascade, provided the transmission lines between adjoining chips are of equal length. The clock signal at the input to each chip will therefore arrive at the identical time or before a corresponding data signal is input to the same chip. The requirement for off-chip clock distribution is eliminated and the system provides only a single clock line from the clock pulse generator (not shown) to the first chip in a cascaded chain 103. The concept is useful for all control signals that feed multiple chips, including non-time-critical signals since off-chip circuitry and interconnects are simplified.

Figure 3:
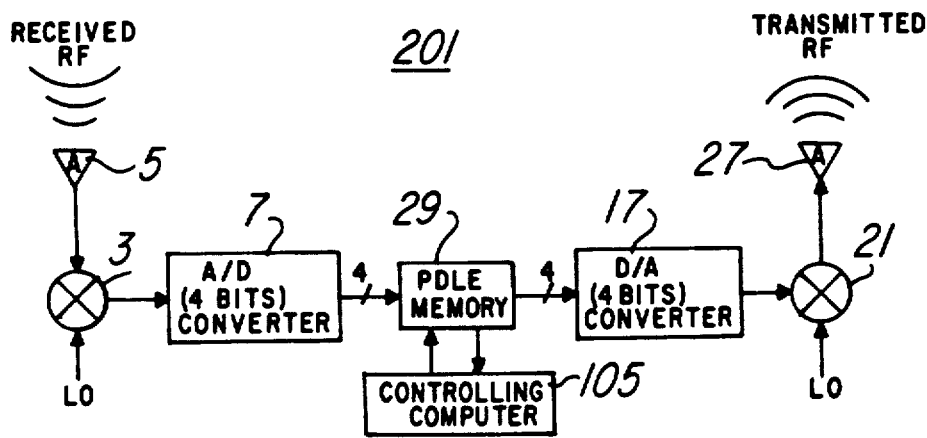
FIG. 3 is a block diagram of a radio frequency signal repeating system according to the invention.
Figure 4:
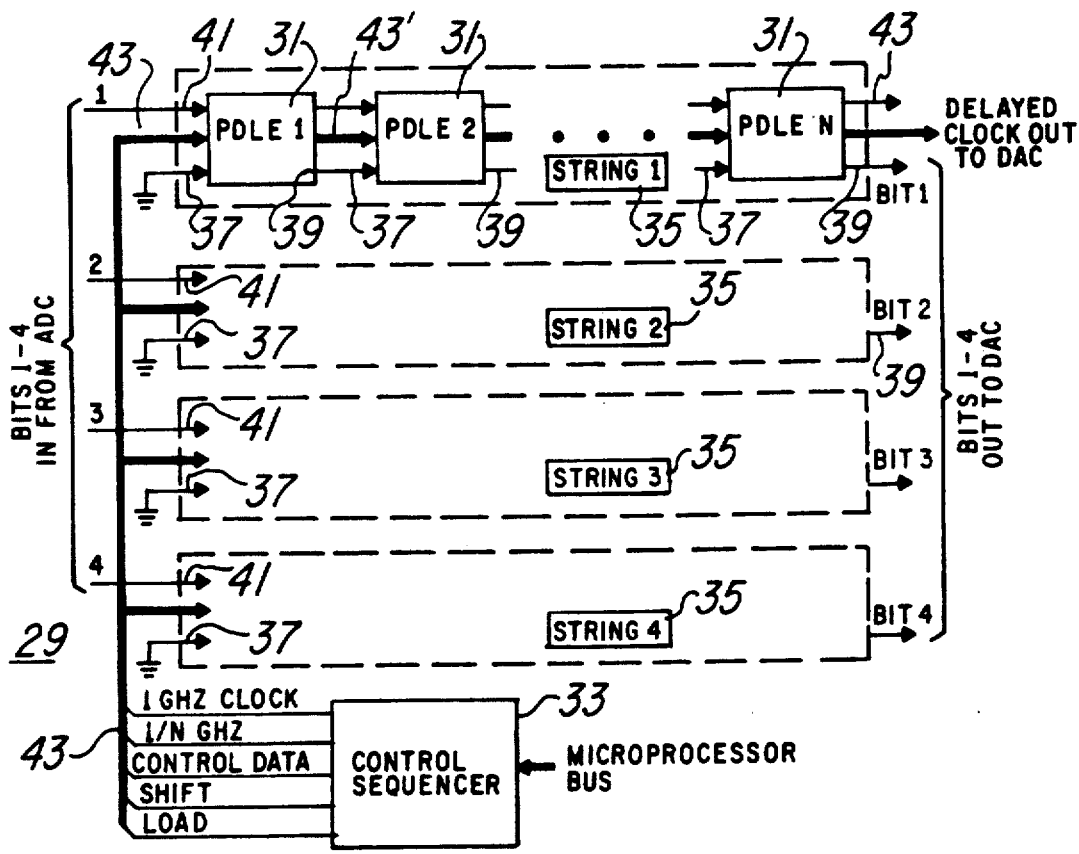
FIG. 4 is a block diagram of a DRFM design implemented with the distributed control for clocking synchronous logic in accordance with the present invention.

Referring to FIG. 3, a DRFM system 201 receives an RF signal through a device such as a radar set after being received and amplified by an antenna. This signal is processed through an amplifier 5 and is down converted by a mixer 3 as per FIG. 1. Next, the signal is digitized by an A/D converter 7. According to one embodiment of the present invention, a four bit output from the A/D converter 7 is applied to a programmable delay line element (PDLE) memory 29. A partial schematic of an exemplary four bit distributed PDLE memory 29 comprising 4N PDLE chips 31 is illustrated in FIG. 4. A feature of the PDLE memory 29 is that under the control of a computer it can simultaneously load and provide output data. Furthermore, the delay between the time data is stored in the PDLE memory 29 and the time the same data is output from the PDLE memory 29 may be varied according to instructions from the controlling computer 105. In the embodiment of FIG. 3, which forms an RF repeater, a radar signal may be received and then retransmitted after a programmed delay in order to distort the location of the repeater system.

The output of the PDLE memory 29 is applied to a four bit D to A converter 17 which converts the digital output from the PDLE memory 29 into an analog signal for up converting by a mixer 21. The signal is then transmitted via amplifier and antenna 27 to complete the circuit for the radio frequency repeater system 201. It should be noted that this system operates in the gigahertz frequency range. Using the distributed control concept of FIGS. 2, 3 and 4, the input demultiplexer, output multiplexer and address generation circuitry can be distributed among the PDLE memory chips 31. Each chip 31 contains a static RAM for data storage. Thus a very simple RF memory architecture is possible with the PDLE memory 29.

During data acquisition each input bit from the analog to digital converter passes through a serial string of N PDLE chips 31. A given stream of data passing through a string of chips 31 is demultiplexed by the N chips and each datum is stored in a chip. During playback or transmit, the PDLE chips 31 reassemble (multiplex) the original data stream and shift it out to the digital to analog converter 17. The PDLE chips 31 internally buffer all five control signals (the clock signals FS and FS/N (where N is the number of chips in the string) control data signal, shift signal and load signal) to avoid the need for external buffers and to maintain time alignment between signals. A simple GaAs control sequencer 33 generates the control signals in response to an input clock signal from a clock generator and an input microprocessor bus. For an application involving 1 GHz analog to digital converters and digital to analog converters if each PDLE chip 31 contains 1 k-bit of RAM, the total memory length of this design is N microseconds, where N is the number of PDLE chips 31 in each string 35 shown in FIG. 5.

FIG. 5, to which reference should now be made, is a block diagram of the PDLE chip 31. Data bus 43 (see also FIG. 4) provides control and timing signals to the PDLE chip 31. These include a control data signal, a shift signal, a load signal, and clock signals FS, and FS/N (where N is the number of PDLE chips that are in each string 35 of FIG. 4). Received RF digital data enters the chip 81 along transmission path 41, is passed through buffer amplifier 12 and applied to a single input dual output serial to parallel converter 26 where the received data is placed in parallel form for application to the random access memory 38 which in the embodiment of FIG. 5 is a 1 kilobit random access memory. Depending on the timing of the FS/N clock signal, the received data is both loaded into the RAM 38 and passed through to an output buffer amplifier 20 to an output data transmission line 43 for application to the next PDLE element in the string 35. Similarly the RF data that has been stored on preceding chips 31 and which is being assimilated with a programmable delay enters the subsequent chip 31 along transmission line 37 where it is provided to an input buffer amplifier 14. If the PDLE chip 31 is in the first position in the string 35, then the transmission line 37 is connected to ground as shown in FIG. 4. Data being assimilated flows through subsequent chips 31 along line 37 and is input to one port of a parallel to serial converter 28. As further illustrated in FIG. 5, the parallel to serial converter 28 also receives data from the RAM 38 at the frequency FS/N and assimilates this data with the data entering the chip 31 along line 37 at the frequency FS/N.

The remainder of the circuit elements of the PDLE chip 31 are used to control this operation. FIG. 5 schematically illustrates shift register 34 and decode logic 36 generating on chip various timing signals, based on FS and FS/N, for operation of the numerous circuit components, e.g., converters 26, 28 and 46, counters and memory 38. The FS and FS/N clock signals are buffered by output buffer amplifiers 22 and 32 and then passed along the string 35 to the D/A converter 17.

A counter 24 receives an output from the shift register 34 and decode logic 36. The counter state is stored within an internal latch. The counter 24 generates the write address and the latch maintains this address at a stable condition for application to the RAM 38 via a multiplexer 50. The write address is also provided to the subtractor and latch combination. The read address is applied to the RAM 38 by the multiplexer 50 and the subtractor and latch combination 48. The subtractor and latch combination 48 in the embodiment of FIG. 5 is a 10 bit ripple carry adder which performs a subtraction by complementing the write address stored in the latch of the counter 24, adding the complemented write address to the delay word that is provided by the serial to parallel converter 46 and complementing the results. The latched output provides a stable signal to the multiplexer 50 while the subtractor generates the next read address. Thus when a programmable delay word is applied to the subtractor latch combination 48 via the serial to parallel converter 46 the word is subtracted from the write address to obtain the address of the word that is to be read and transmitted via the parallel to serial converter 28 and output buffer 30.

The control data, shift and load signals are the mode control signals. These signals are applied via buffers 40, 42 and 44 to the serial to parallel converter 46 which in the embodiment of FIG. 5 is a 12 bit shift register with latched output. The shift signal shifts the serial to parallel converter 46 while the load signal latches the shift outputs after a 12 bit transfer has been completed thus freeing the serial to parallel converter 46 to accept the next 12 bit transfer. The 12 bit data that is stored within the 12 bit serial to parallel converter 46 contains 10 bit delaying information for application to the subtractor latch 48 and 2 bits of mode information that is applied to a decode circuit 52. The decode circuits decode the mode of information which includes four states: reset, received only, transmit only, and simultaneously receive and transmit data with a programmable delay. The control data, shift, and load signals are passed on to the next PDLE chip 31 via the output buffers 58, 56, and 54, respectively.

FIG. 6 is a block diagram of the sequencer 33 of FIG. 4. The data control buffer latch 50 receives data and write commands from the controlling computer 105 (see also FIG. 3). It converts the received data into serial control, i.e., mode and delay information which is provided to the input buffer 40 of each string 35 of the PDLE memory 29. A decoder 51 processes shift and load signals from the controlling computer 105 under the control of the write commands. The data control and buffer latch also provides the receive ready signal back to the controlling computer 105 indicating that the data has been received.

According to the embodiment of FIGS. 3 and 6, clock source 52 generates a 1 gigahertz signal, denoted FS, which is provided to N divider 53 which generates the signal FS/N. With these commands and the decode logic of FIG. 5, each PDLE chip can shift among mode states to receive data, store the received data, pass on the received data; and transmit stored data or pass on stored data to provide a programmable delay line element.

It can be seen that there has been provided a chip which is readily cascadable and wherein clock signals provided to the first chip of the chain are serially transmitted to other chips downstream to generate other time and control signals on individual chips. This eliminates the need for tree circuit clock signal connections to each chip along with the associated circuitry required to ensure that the signals arrive at a predetermined time.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A semiconductor chip for processing or storing information comprising:
   (a) clock input circuitry connected to a first chip for receiving clock signals of a first frequency therefrom;
   (b) clock output circuitry connected to a second chip for transmitting said clock signals to said second chip;
   (c) transmission/receiving circuitry connected to said first chip for receiving data therefrom and connected to said second chip for transmitting data thereto, said transmission/receiving circuitry including means to sample said data at a second frequency less than said first frequency; and
   (d) circuit components operatively coupled to said clock input circuitry and transmission/receiving circuitry for processing said data,
   (e) said circuit components include a memory array for storing data receivable via said transmission/receiving circuitry in a digital form and for providing storable data to said transmission circuitry; and
   (f) said transmission circuitry includes a first transmission path for transmitting data received from said first chip directly to said second chip and means including a second transmission path for combining data which is stored in said memory array with other stored data.

2. A semiconductor chip for processing or storing information comprising:
   (a) clock input circuitry connected to a first chip for receiving clock signals of a first frequency therefrom, said clock input circuitry includes plural signal paths for receiving multiple clock signals;
   (b) clock output circuitry connected to a second chip for transmitting said clock signals to said second chip, said clock output circuitry includes plural paths for outputting said multiple clock signals;
   (c) transmission/receiving circuitry connected to said first chip for receiving data therefrom and connected to said second chip for transmitting data thereto, said transmission/receiving circuitry including means to sample said data at a second frequency less than said first frequency; and
   (d) circuit components operatively coupled to said clock input circuitry, said circuit components receiving first and second clock frequencies, the first clock frequency being a multiple of the frequency of the second clock frequency and transmission/receiving circuitry for processing said data.

3. A system for processing or storing digitized information comprising:
   (a) a plurality of synchronous semiconductor chips electrically connected in a cascade arrangement to effect serial flow of timing signals and data through said plurality of chips, each chip including:
   (b) clock input circuitry for receiving timing signals at a first frequency from a preceding chip in said cascade arrangement;
   (c) clock output circuitry for serially transmitting received clock signals to a subsequent chip in said cascade arrangement;
   (d) data transmission circuitry serially connected to a preceding chip for receiving digital data therefrom and serially connected to a subsequent chip for transmitting data thereto, said transmission circuitry includes a first transmission path for providing data received from a preceding chip to a subsequent chip and a second transmission path for serially providing data stored in said memory array to a subsequent chip;
   (e) circuit components operatively coupled to said clock circuitry and transmission circuitry for processing said digital data, said circuit components include a memory array and an address generator for storing and reading out data with a programmable delay via said transmission circuitry;
   (f) second input circuitry for selecting a variable delay between the time data that is received onto the chip and the time data that is transmitted from the chip, and
   (g) further including plural said second transmission paths, wherein said second transmission paths of adjoining chips in said cascade arrangement are serially connected with one another to assimilate data stored on different chips.

4. A system for processing or storing digitized information wherein said system is configured as a digital rf memory system for storing and transmitting rf data with a programmable delay comprising:
   (a) a first converter for digitizing analog rf data;
   (b) a second converter for restoring digitized rf data to analog form,
   (c) a plurality of synchronous semiconductor chips electrically connected in a cascade arrangement to effect serial flow of timing signals and data through said plurality of chips, said cascade arrangement including N chips, a first chip in said cascade arrangement receiving digitized data from said first converter and the last chip in said cascade arrangement coupled to provide digitized data to said second converter, each said chip including:
   (d) clock input circuitry for receiving timing signals at a first frequency from a preceding chip in said cascade arrangement;
   (e) clock output circuitry for serially transmitting received clock signals to a subsequent chip in said cascade arrangement;
   (f) data transmission circuitry serially connected to a preceding chip for receiving digital data therefrom and serially connected to a subsequent chip for transmitting data thereto;
   (g) circuit components operatively coupled to said clock circuitry and transmission circuitry for processing said digital data; and
   (h) second input circuitry for selecting a variable delay between the time data that is received onto the chip and the time data that is transmitted from the chip.

5. The system of claim 4 wherein the first converter transforms analog data into multibit digital words and outputs each word as parallel bit streams, said system further comprising:
   a plurality of additional cascaded arrangements of synchronous chips, each arrangement including N chips, the first chip in each arrangement coupled to receive a bit stream of data from the first converter and the last chip in the arrangement coupled to provide digitized data to the second converter.

6. The system of claim 5 wherein the first converter generates four bit streams.

7. A semiconductor chip for processing or storing information comprising;
   (a) clock input circuitry connected to a first chip for receiving clock signals at a first frequency;

(b) clock output circuitry connected to a second chip for transmitting said clock signals to the second chip;

(c) transmission circuitry connected to said first chip for receiving data therefrom and connected to said second chip for transmitting data thereto;

(d) circuit components operatively coupled to said clock input and clock output circuitry and said transmission circuitry for processing said data; and (e) circuitry for selecting a variable delay between the time data is received onto the chip and transmitted from the chip, and (f) wherein the circuit components include a random access memory for storage of digital data, said transmission circuitry capable of sampling the data at a second frequency less than the first frequency, said components capable of writing a datum of information to a write address in said memory and reading another datum of information from a read address in said memory within a cycle of the second frequency, and said variable delay being proportional to differences between the read and write addresses.

8. The semiconductor chip of claim 7 wherein said transmission circuitry samples and stores data at a second clock frequency which is less than said first frequency.

9. A system for processing or storing digitized information comprising:

a plurality of synchronous semiconductor chips electrically connected in a cascade arrangement to effect serial flow of timing signals and data through the plurality of chips, each chip includes a memory array for storing data receivable via transmission circuitry and for providing storable data to the transmission circuitry, and each chip including:

clock input circuitry for receiving timing signals of a first frequency from any serially connected preceding chips in the cascade arrangement;

clock output circuitry for serially transmitting received clock signals to any subsequent chips in the cascade arrangement;

data transmission circuitry serially connected to any preceding chips for receiving digital data therefrom and serially connected to any subsequent chips for transmitting data thereto, said transmission circuitry capable of sampling the data at a second clock frequency less than the first frequency, and the transmission circuitry includes a first transmission path for receiving data from any preceding chip in the cascade arrangement and providing the data to any subsequent chip in the cascade arrangement, the transmission circuitry further including a second transmission path capable of combining data which is stored in the memory array with data which is stored in other chips in the cascade arrangement; and circuit components operatively coupled to the clock circuitry and transmission circuitry for processing the digital data.

* * * * *